United States Patent
Hsieh et al.

(10) Patent No.: US 11,380,776 B2
(45) Date of Patent: Jul. 5, 2022

(54) FIELD-EFFECT TRANSISTOR DEVICE WITH GATE SPACER STRUCTURE

(71) Applicant: Taiwan Semiconductor Manufacturing Company, Ltd., Hsinchu (TW)

(72) Inventors: Wei-Che Hsieh, New Taipei (TW); Chunyao Wang, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/176,970

(22) Filed: Feb. 16, 2021

(65) Prior Publication Data

US 2022/0102527 A1    Mar. 31, 2022

Related U.S. Application Data

(60) Provisional application No. 63/084,909, filed on Sep. 29, 2020.

(51) Int. Cl.
| | |
|---|---|
| *H01L 29/78* | (2006.01) |
| *H01L 29/66* | (2006.01) |
| *H01L 29/51* | (2006.01) |
| *H01L 29/08* | (2006.01) |
| *H01L 29/36* | (2006.01) |

(Continued)

(52) U.S. Cl.
CPC .... *H01L 29/6656* (2013.01); *H01L 21/28518* (2013.01); *H01L 29/0847* (2013.01);
(Continued)

(58) Field of Classification Search
CPC ......... H01L 21/28141; H01L 21/28518; H01L 21/823431; H01L 21/823821; H01L 21/845; H01L 27/0886; H01L 27/0924; H01L 27/10879; H01L 27/1211; H01L 29/0653; H01L 29/0843; H01L 29/0847;
(Continued)

(56) References Cited

U.S. PATENT DOCUMENTS

| | | |
|---|---|---|
| 9,960,273 B2 | 5/2018 | Ching et al. |
| 10,504,990 B2 | 12/2019 | Wu et al. |

(Continued)

FOREIGN PATENT DOCUMENTS

| | | |
|---|---|---|
| KR | 20130078222 A | 7/2013 |
| KR | 20150095626 A | 8/2015 |

(Continued)

*Primary Examiner* — David C Spalla
(74) *Attorney, Agent, or Firm* — Haynes and Boone, LLP

(57) ABSTRACT

Semiconductor devices and methods of forming the same are provided. A method according to the present disclosure includes forming a semiconductor element over a substrate, the semiconductor element including a channel region and a source/drain region, forming a dummy gate stack over the channel region of the semiconductor element, depositing a first spacer layer over sidewalls of the dummy gate stack, depositing a second spacer layer over the first spacer layer, wherein the second spacer layer includes at least one silicon sublayer and at least one nitrogen-containing sublayer, after the depositing of the second spacer layer, etching the source/drain region of the semiconductor element to form a source/drain recess, and after the etching, removing the second spacer layer.

20 Claims, 16 Drawing Sheets

(51) Int. Cl.
*H01L 29/423* (2006.01)
*H01L 29/417* (2006.01)
*H01L 29/49* (2006.01)
*H01L 21/285* (2006.01)
*H01L 29/45* (2006.01)

(52) U.S. Cl.
CPC ........ *H01L 29/41791* (2013.01); *H01L 29/45* (2013.01); *H01L 29/4983* (2013.01); *H01L 29/66545* (2013.01); *H01L 29/66636* (2013.01); *H01L 29/66795* (2013.01); *H01L 29/7851* (2013.01)

(58) Field of Classification Search
CPC ............... H01L 29/41791; H01L 29/45; H01L 29/4983; H01L 29/6653; H01L 29/66545; H01L 29/66553; H01L 29/6656; H01L 29/66636; H01L 29/66795; H01L 29/7848; H01L 29/785; H01L 29/7851; H01L 29/7853; H01L 29/7855; H01L 2029/7858
See application file for complete search history.

(56) References Cited

U.S. PATENT DOCUMENTS

| | | | |
|---|---|---|---|
| 2011/0241128 | A1 | 10/2011 | O'Meara et al. |
| 2013/0171810 | A1 | 7/2013 | Sun et al. |
| 2015/0307819 | A1 | 10/2015 | Ida et al. |
| 2016/0343858 | A1 | 11/2016 | Kim et al. |
| 2018/0175169 | A1 | 6/2018 | Yi et al. |
| 2020/0006151 | A1* | 1/2020 | Kao .................. H01L 29/66795 |
| 2020/0066894 | A1* | 2/2020 | Frougier ............. H01L 29/0847 |
| 2020/0127109 | A1* | 4/2020 | Wang .................. H01L 21/7682 |
| 2020/0135915 | A1 | 4/2020 | Savant et al. |
| 2020/0135922 | A1* | 4/2020 | Chen .................. H01L 29/6659 |

FOREIGN PATENT DOCUMENTS

| | | |
|---|---|---|
| KR | 20160078477 A | 7/2016 |
| KR | 20160137772 A | 12/2016 |
| KR | 20200050402 A | 5/2020 |
| TW | 202020965 A | 6/2020 |
| WO | 2015069521 A1 | 5/2015 |

\* cited by examiner

FIELD-EFFECT TRANSISTOR DEVICE WITH GATE SPACER STRUCTURE

PRIORITY DATA

This application claims priority to U.S. Provisional Patent Application No. 63/084,909, filed on Sep. 29, 2020, entitled "Field-Effect Transistor Device with Gate Spacer Structure," the entire disclosure of which is hereby incorporated herein by reference.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, such scaling down has also been accompanied by increased complexity in design and manufacturing of devices incorporating these ICs, and, for these advances to be realized, similar developments in device fabrication are needed.

Gate replacement processes may be used to fabricate a multi-gate transistor such as a fin-type field effect transistor (FinFET) or a multi-bridge-channel (MBC) transistor. Taking fabrication of a FinFET as an example, a dummy gate is first formed over a channel region of a fin and a gate spacer is formed along sidewalls of the dummy gate. Using the gate spacer and the dummy gate as a mask, source/drain regions of the fin are recessed ahead of the formation of epitaxial source/drain features over the source/drain regions. The dummy gate is subsequently removed and replaced with a functional gate. Because the dummy gate defines the functional gate, damages to the dummy gate may translate into defects or nonuniformity of the functional gate. The gate spacer functions to protect the top and sidewall profiles of the dummy gate during various dry or wet etch processes leading to the gate replacement.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
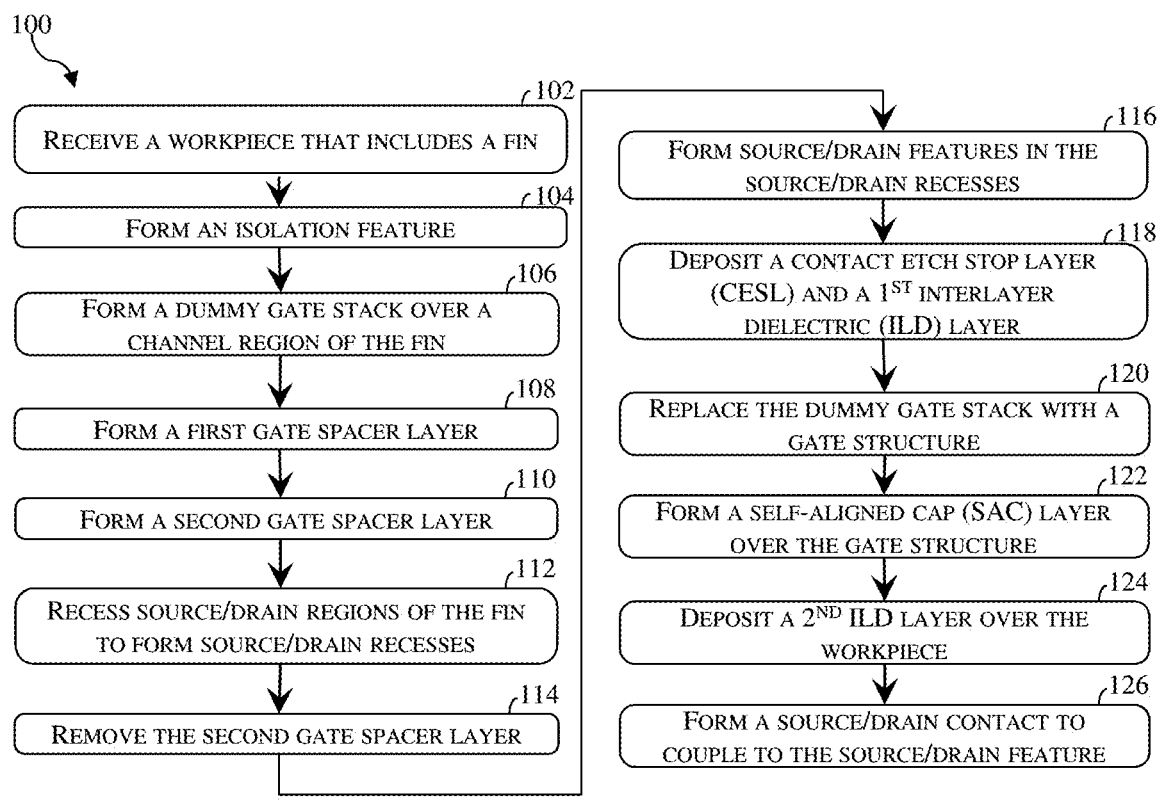
FIG. 1 is a flowchart of a method for fabricating a semiconductor device, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +1-15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

The present disclosure is related to a structure of or a process to form a multi-gate transistor. Particularly, the present disclosure is related to a multi-gate device that includes a gate spacer having a silicon sublayer and a nitrogen-containing sublayer.

As integrated circuit (IC) technologies progress towards smaller technology nodes, multi-gate metal-oxide-semiconductor field effect transistor (multi-gate MOSFET, or multi-gate devices) have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor.

Gate replacement processes may be used to fabricate a multi-gate device. Taking fabrication of a FinFET as an example, a dummy gate is first formed over a channel region of a fin and a gate spacer is formed along sidewalls of the dummy gate. Using the gate spacer and the dummy gate as a mask, source/drain regions of the fin are recessed ahead of the formation of epitaxial source/drain features over the source/drain regions. The dummy gate is subsequently removed and replaced with a functional gate. The gate spacer functions to protect the top and sidewall profiles of the dummy gate during various dry or wet etch processes leading to the gate replacement. For instance, if the gate spacer does not provide sufficient protection, the etching of the source/drain regions may alter the profile of the dummy gate, causing height loss or undesirable triangular top profile. When that happens, gate heights among gate structures may be nonuniform and the yield may be impacted. Additionally, thickness loss of the gate spacer may also lead to shorts between the gate structure and the source/drain features.

The present disclosure provides processes and structures to better protect the dummy gate. In some embodiments, after the formation of a fin over a substrate and a dummy gate stack over the fin, a first gate spacer layer and a second gate spacer layer are sequentially deposited along sidewalls of the dummy gate stack. The first gate spacer layer may be a low-k dielectric layer. The second gate spacer layer includes a silicon sublayer and a nitrogen-containing sublayer. The silicon sublayer may also be referred to as a silicon soak layer and may be formed by atomic layer deposition (ALD) or plasma-enhanced ALD (PEALD). The nitrogen-containing sublayer may include silicon carbonitride, silicon boron nitride, silicon nitride, silicon oxycarbonitride, or silicon oxynitride and may be formed by ALD or PEALD. In some embodiments, multiple silicon sublayers and nitrogen-containing sublayers are alternately deposited to form the second gate spacer layer. During an etch process, etchants may react with the silicon sublayer to produce polymeric byproducts that includes silicon, carbon, oxygen, or fluorine. The polymeric byproducts may be redeposited on the first spacer layer and provide additional protection to the first spacer layer.

The various aspects of the present disclosure will now be described in more detail with reference to the figures. FIG. 1 is a flowchart of a method 100 for fabricating a semiconductor device according to various aspects of the present disclosure. Method 100 is merely an example and is not intended to limit the present disclosure to what is explicitly illustrated in method 100. Additional steps can be provided before, during, and after method 100, and some of the steps described can be moved, replaced, or eliminated for additional embodiments of method 100. Not all steps are described herein in detail for reasons of simplicity. Method 100 will be described below in conjunction with the fragmentary cross-sectional views of a workpiece 200 shown in FIGS. 2-15. Because a semiconductor device will be formed from the workpiece 200, the workpiece 200 may be referred to as semiconductor device 200 as the context requires. Additionally, throughout the present disclosure, like reference numerals denote like features, unless otherwise described. It is noted that, while method 100 is described in conjunction with FIGS. 2-15, which illustrate formation of a FinFET, the present disclosure is not so limited. Method 100 and many aspects of the present disclosure may be applied to other types of multi-gate devices, such as MBC transistors.

Figure 2:
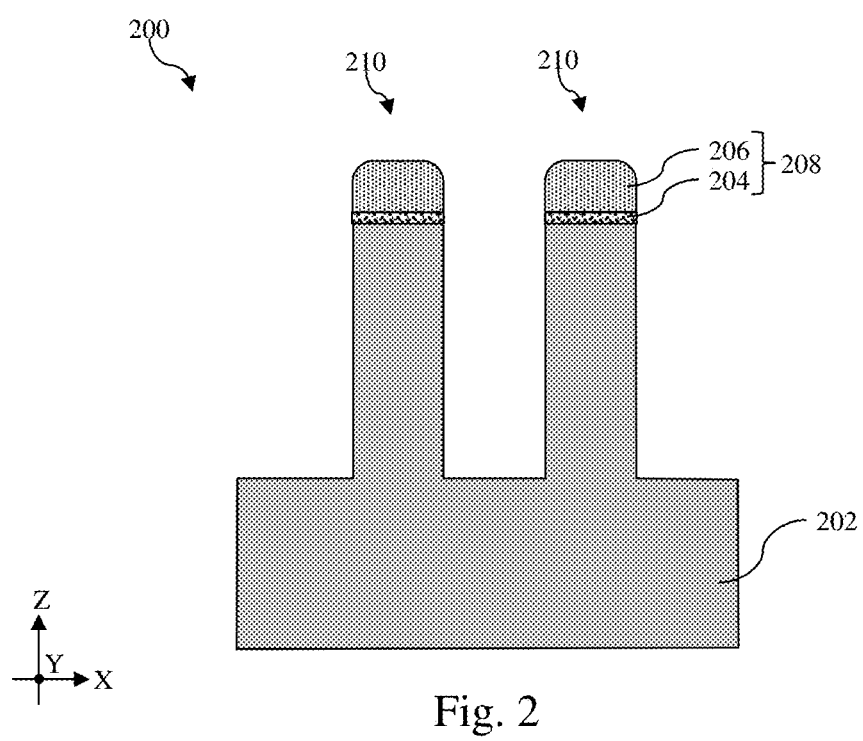
FIGS. 2-15 are fragmentary schematic cross-sectional views of a workpiece at various fabrication stages, such as those associated with the method in FIG. 1, according to various aspects of the present disclosure.

Referring to FIGS. 1 and 2, method 100 includes a block 102 where a workpiece 200 that includes a fin 210 is received. The workpiece 200 includes a substrate 202. In the depicted embodiment, substrate 202 is a bulk substrate that includes silicon (Si). Alternatively, in some implementations, substrate 202 includes a bulk substrate (including, for example, silicon) and one or more material layers disposed over the bulk substrate. For example, the one or more material layers can include a semiconductor layer stack having various semiconductor layers (such as a heterostructure) disposed over the bulk substrate, where the semiconductor layer stack is subsequently patterned to form fins. The semiconductor layers can include any suitable semiconductor materials, such as silicon (Si), germanium (Ge), silicon germanium (SiGe), other suitable semiconductor materials, or combinations thereof. The semiconductor layers can include same or different materials, etching rates, constituent atomic percentages, constituent weight percentages, thicknesses, and/or configurations depending on design requirements of the semiconductor device 200. Alternatively or additionally, the bulk substrate 202 and/or the one or more material layers include another elementary semiconductor, such as germanium (Ge); a compound semiconductor, such as silicon carbide (SiC), silicon phosphide (SiP), gallium arsenide (GaAs), gallium phosphide (GaP), indium phosphide (InP), indium arsenide (InAs), indium antimonide (InSb), zinc oxide (ZnO), zinc selenide (ZnSe), zinc sulfide (ZnS), zinc telluride (ZnTe), cadmium selenide (CdSe), cadmium sulfide (CdS), and/or cadmium telluride (CdTe); an alloy semiconductor, such as silicon germanium (SiGe), silicon phosphorus carbide (SiPC), gallium arsenic phosphide (GaAsP), aluminum indium arsenide (AlInAs), aluminum gallium arsenide (AlGaAs), gallium indium arsenide (GaInAs), gallium indium phosphide (GaInP), and/or gallium indium arsenic phosphide (GaInAsP); other group III-V materials; other group II-V materials; or combinations thereof. Alternatively, substrate 202 is a semiconductor-on-insulator substrate, such as a silicon-on-insulator (SOI) substrate or a germanium-on-insulator (GeOI) substrate. Semiconductor-on-insulator substrates can be fabricated using separation by implantation of oxygen (SIMOX), wafer bonding, and/or other suitable methods.

As shown in FIG. 2, the workpiece 200 may include a plurality of fins 210. In some embodiments, the plurality of fins 210 may be formed using one or more photolithography processes and one or more etching processes. In some implementations, the plurality of fins 210 may be formed using a single patterning process or a multiple-patterning process. Examples of multiple-patterning processes include a double patterning lithography (DPL) process (for example, a lithography-etch-lithography-etch (LELE) process, a self-aligned double patterning (SADP) process, a spacer-is-dielectric patterning (SIDP) process, other double patterning process, or combinations thereof), a triple patterning process (for example, a lithography-etch-lithography-etch-lithography-etch (LELELE) process, a self-aligned triple patterning (SATP) process, other triple patterning process, or combinations thereof), other multiple patterning process (for example, self-aligned quadruple patterning (SAQP) process), or combinations thereof. To form the plurality of fins 210, a fin top hard mask layer 208 is deposited over the substrate 202 and then patterned to form a patterned fin top hard mask layer 208. The patterned fin-top hard mask layer 208 is then applied as an etch mask to etch the substrate 202 (or a semiconductor layer stack thereon) to form the plurality of fins 210. The fin top hard mask layer 208 may be a single layer or a multi-layer. FIG. 2 illustrates a multi-layer fin top hard mask layer 208 that includes a first fin top layer 204 and a second fin top layer 206. In some instances, the first fin top layer 204 may be formed of silicon nitride, silicon oxynitride, silicon carbonitride, or other suitable material and the second fin top layer 206 may be formed of silicon oxide or other suitable dielectric material. The first fin top layer 204 and the second fin top layer 206 may be deposited using chemical vapor deposition (CVD), atomic layer deposition (ALD), or other suitable method. In FIG. 2, each of the fins 210 extends lengthwise along the Y direction and rises from the substrate 202 long the Z direction. The fin top hard mask layer 208 may be rounded as a result of the formation processes for the fins 210.

Figure 3:
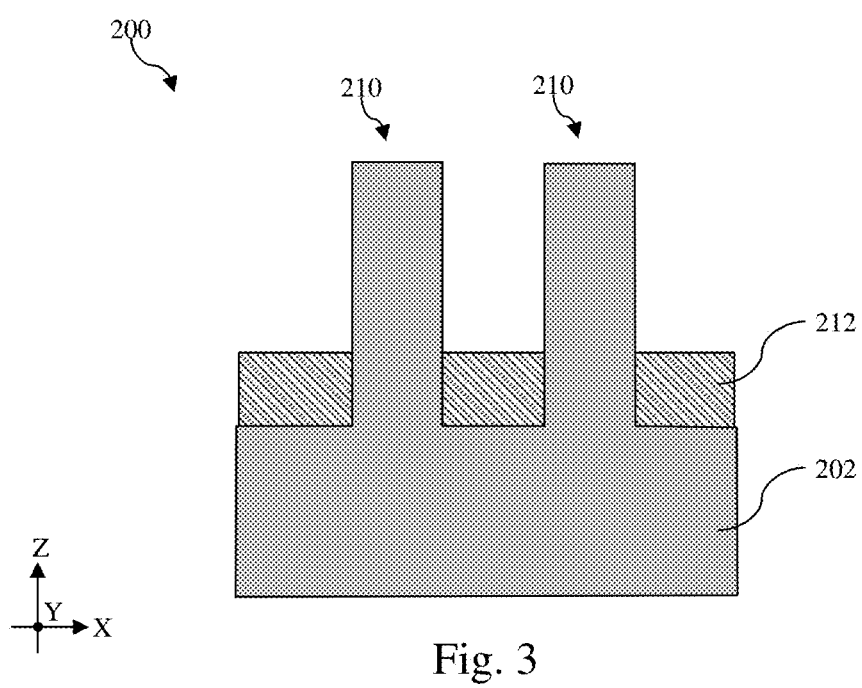

Referring to FIGS. 1 and 3, method 100 includes a block 104 where an isolation feature 212 is formed. To isolate the plurality of fins 210 from one another, the isolation feature 212 is deposited over the workpiece 200, including over the plurality of fins 210 as well as the fin top hard mask layer 208. In some embodiments, the isolation feature 212 may be a shallow trench isolation (STI) layer formed of a dielectric material that is deposited using flowable chemical vapor deposition (FCVD), spin-on coating, CVD, or other suitable method. Such dielectric material may include silicon oxide, silicon oxynitride, fluorine-doped silicate glass (FSG), a low-k dielectric, combinations thereof, and/or other suitable materials. In some embodiments, an anneal process or an ultraviolet (UV) curing process may be performed to cure the deposited dielectric material. The deposited dielectric material is planarized by using, for example, a chemical mechanical polishing (CMP). Then the planarized dielectric material is etched back to form the isolation feature 212 such that the fins 210 rise above the isolation feature 212, as shown in FIG. 3.

Figure 4:
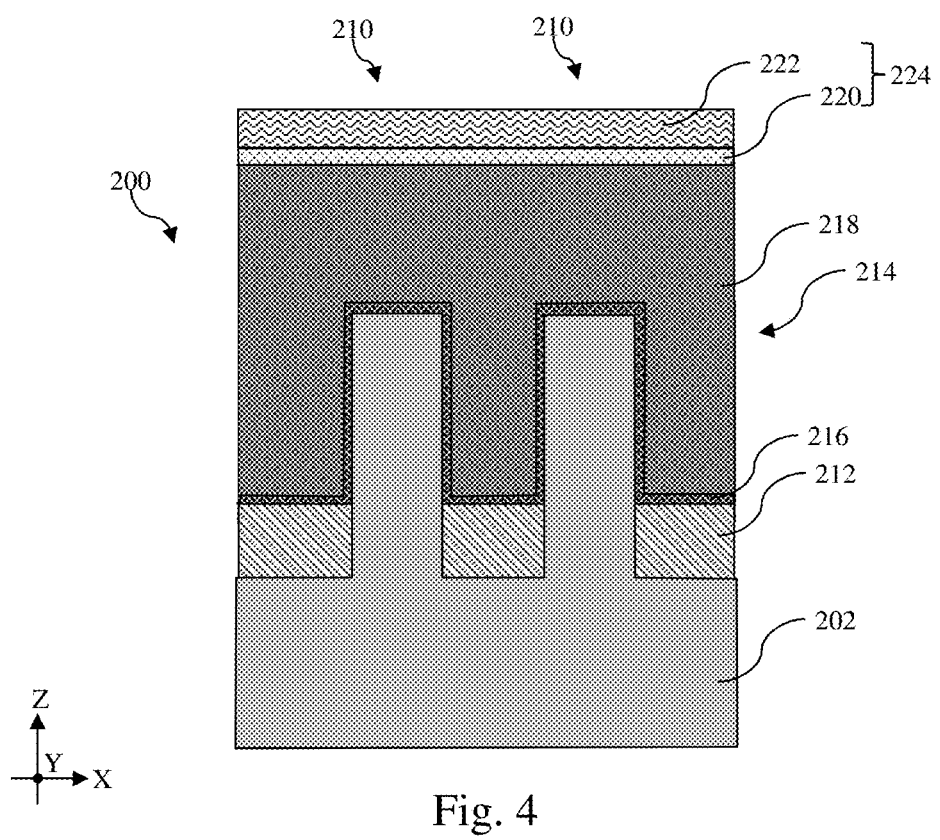
Figure 5:
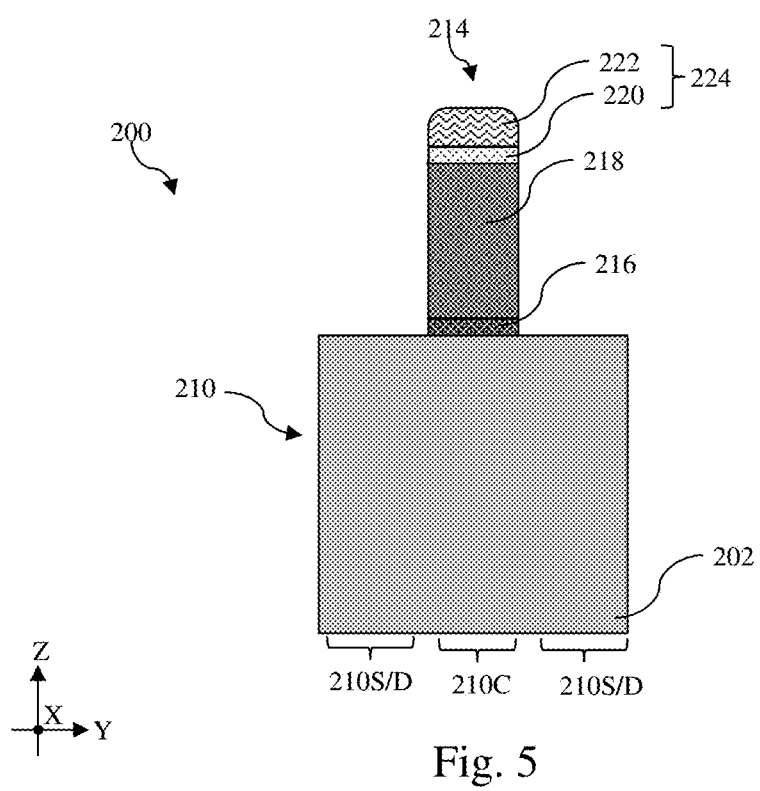

Referring to FIGS. 1, 4 and 5, method 100 includes a block 106 where a dummy gate stack 214 is formed over a channel region 210C of the fin 210. In some embodiments, a gate replacement process (or gate-last process) is adopted where the dummy gate stack 214 serves as a placeholder to undergo various processes and is to be removed and replaced by the functional gate structure, such as the gate structure 240 to be described further below. Other processes and configuration are possible. In some embodiments illustrated in FIG. 5, the dummy gate stack 214 is formed over a fin 210 and the fin 210 may be divided into a channel region 210C underlying the dummy gate stacks 214 and source/drain regions 210SD that do not underlie the dummy gate stacks 214. The channel region 210C of the fin 210 is adjacent the source/drain regions 210SD. The channel region 210C is disposed between two source/drain regions 210SD along the Y direction. As shown in FIGS. 4 and 5, the dummy gate stack 214 may include a dummy dielectric layer 216 and a dummy electrode layer 218. In some embodiments, the dummy dielectric layer 216 may include silicon oxide and the dummy electrode layer 218 may include polysilicon (poly Si). The dummy dielectric layer 216 may be formed on the fin 210 using a chemical vapor deposition (CVD) process, an ALD process, an oxygen plasma oxidation process, a thermal oxidation process, or other suitable processes. The dummy electrode layer 218 may be deposited over the dummy dielectric layer 216 using a CVD process, an ALD process, or other suitable processes. To pattern the dummy dielectric layer 216 and the dummy electrode layer 218 into the dummy gate stack 214, the gate-top hard mask layer 224 may be deposited on the dummy electrode layer 218 using a CVD process, an ALD process, or other suitable processes. In the depicted embodiments, the gate top hard mask layer 224 may be a multi-layer and may include a silicon nitride layer 220 and a silicon oxide layer 222 over the silicon nitride layer 220. In other embodiments, the gate top hard mask layer 224 may include a silicon oxide layer and a silicon nitride layer over the silicon oxide layer. The gate-top hard mask layer 224 is then patterned to serve as an etch mask to etch the dummy electrode layer 218 and the dummy dielectric layer 216 to form the dummy gate stack 214, as shown in FIG. 5.

Figure 6:
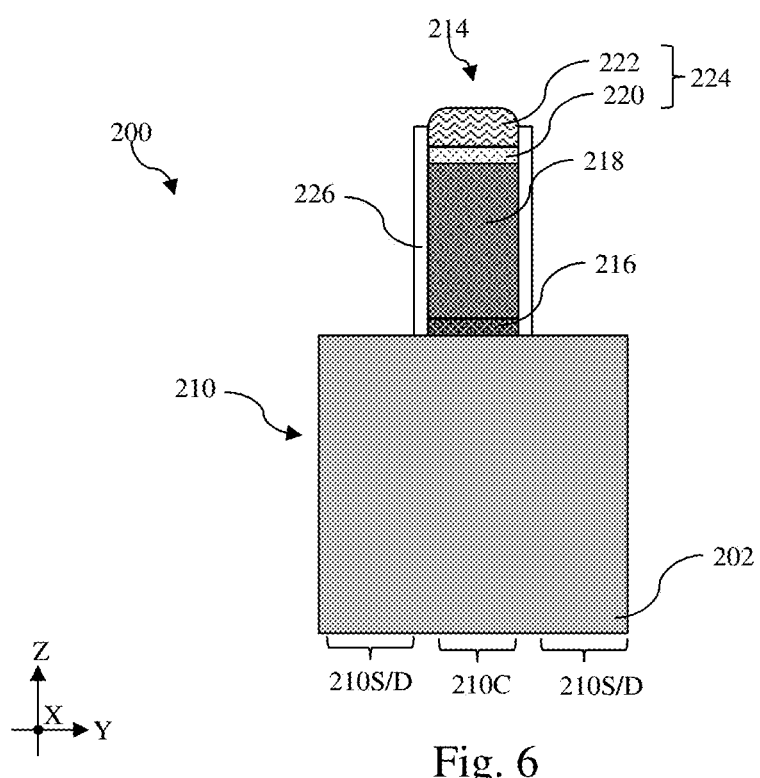

Referring to FIGS. 1 and 6, method 100 includes a block 108 where a first gate spacer layer 226 is formed. Subsequent to the formation of the dummy gate stack 214, the first gate spacer layer 226 is deposited over the dummy gate stack 214 as well as source/drain regions 210SD of the fin 210. In some embodiments, the first gate spacer layer may be deposited using ALD, CVD, or other suitable methods. In some embodiments, to reduce parasitic capacitance between the subsequently formed gate structure and adjacent source/drain features, the first gate spacer layer 226 may include a low-k dielectric material. As used herein, a low-k dielectric material refers to a dielectric material with a dielectric constant equal to or lower than that of thermal silicon oxide. In some implementations, the first gate spacer layer 226 may include silicon oxide, porous silicon oxide, silicon oxycarbonitride, fluorinated silica glass (FSG), carbon doped silicon oxide, xerogel, aerogel, amorphous fluorinated carbon, parylene, BCB (bis-benzocyclobutenes), polyimide, and/or other materials, according to some embodiments. The deposited first gate spacer layer 226 is then pulled back or etched back using a dry etch process to remove the first gate spacer layer 226 on top-facing surfaces. After the etch back process, the first gate spacer layer 226 is disposed along sidewalls of the fin 210, as shown in FIG. 6.

Figure 7:
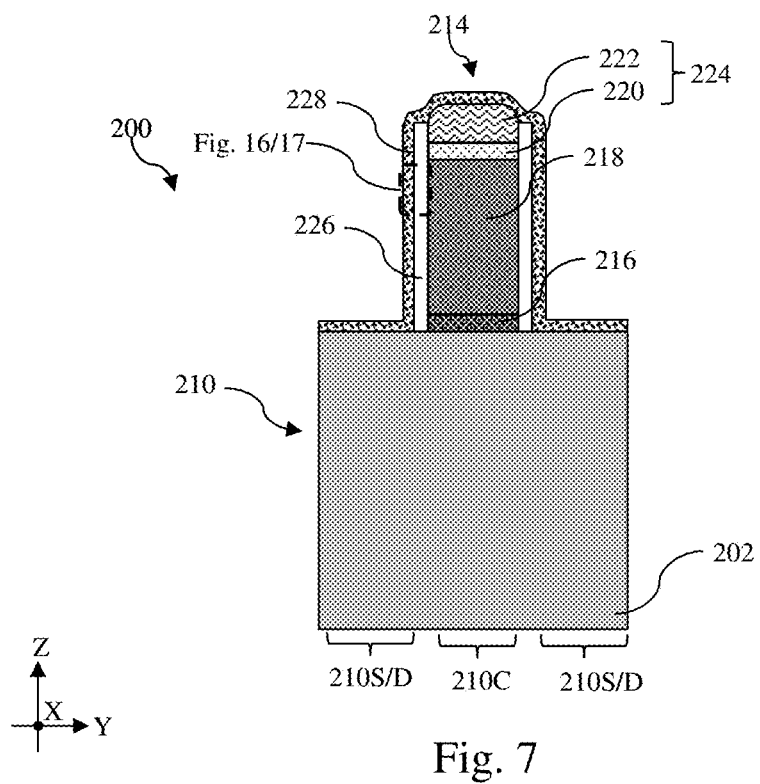
Figure 8:
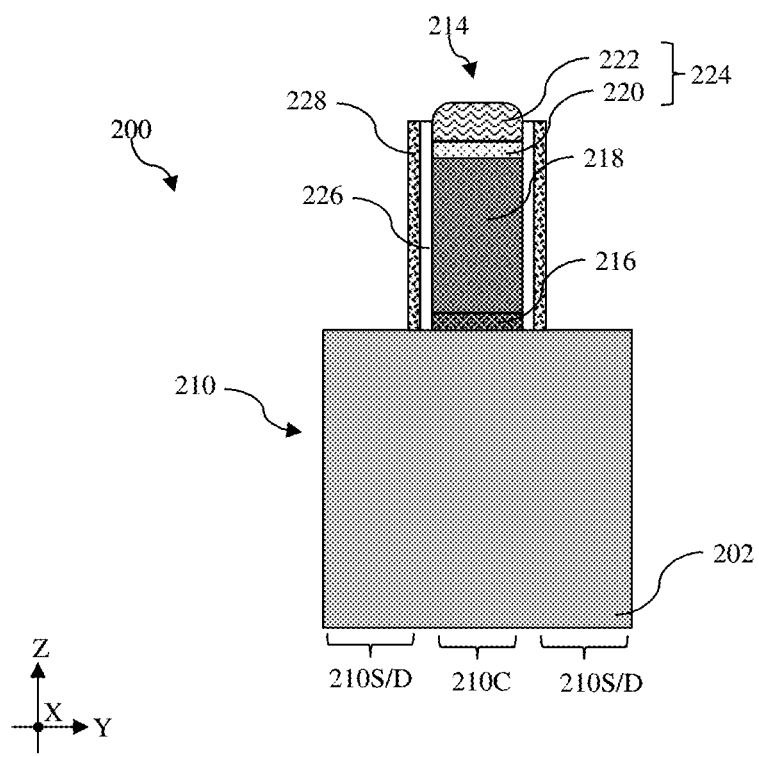

Referring to FIGS. 1, 7 and 8, method 100 includes a block 110 where a second gate spacer layer 228 is formed. Reference is first made to FIG. 7. In some embodiments, the second gate spacer layer 228 is a multi-layer and includes at least one silicon sublayer and at least one nitrogen-containing layer. Each of the at least one silicon sublayer may be formed by thermal atomic layer deposition (ALD) using a silicon-based precursor. Examples of such a silicon-based precursor may include dichlorosilane (DCS), monochlorosilane (MCS), or hexachlorodisilane (HCD). The process temperature for depositing the silicon sublayer may vary when different silicon-based precursors are used. In instances where DCS is used as a precursor, the deposition temperature of the ALD process may be between about 500° C. and about 600° C. In instances where MCS is used as a precursor, the deposition temperature of the ALD process may be between about 350° C. and about 450° C. In instances where hexachlorodisilane (HCD) is used as a precursor, the deposition temperature may be between about 540° C. and about 640° C. It is observed that when the deposition temperature of a silicon sublayer is below the foregoing deposition temperature range, the activation energy for the surface reaction may not be reached and the deposition may not take place effectively. When the deposition temperature exceeds the foregoing deposition temperature range, the ALD deposition at block 110 may happen too quickly and become more CVD-like, resulting in undesirable trench filling and insufficient room to form the at least one nitrogen-containing layer. In some embodiments, the deposition pressure for the at least one silicon sublayer may be between about 1 Torr and about 10 Torr. Each of the at least one nitrogen-based sublayer may be formed by thermal atomic layer deposition (ALD) or plasma-enhanced ALD (PEALD). In some embodiments, each of the at least one nitrogen-based sublayer may include silicon carbonitride, silicon boron nitride, silicon nitride, silicon oxynitride, or silicon oxycarbonitride. In some alternative implementations where the device dimensions are greater, CVD may be used to deposit the second gate spacer layer 228 without the risk of overfilling. The dielectric constant of the silicon sublayer (about 11) and the dielectric constant of the nitrogen-containing sublayer (about 7) are greater than the dielectric constant of the first gate spacer layer 226 (around or smaller than 3.9).

In some implementations, a thickness of the nitrogen-based sublayer is greater than a thickness of the silicon sublayer. In some instances, the thickness of the silicon sublayer is between 0.1 Angstrom (Å) and about 20 Å. As will be described further below, the silicon sublayer in the second gate spacer layer 228 protects the sidewalls and profiles of the dummy gate stack 214 by reacting with oxygen-containing etchant/reactant in subsequent etch processes. Such a reaction may produce polymeric byproduct that may be redeposited on the sidewalls of the first gate spacer layer 226, thereby slowing down the etching of the first gate spacer layer 226. For example, fluorocarbons (e.g. fluoromethane ($CH_3F$)) and oxygen ($O_2$) used during the etching at block 112 may react with the silicon sublayer to produce silicon containing polymers that include silicon (Si), carbon (C), oxygen (O), and fluorine (F). When the silicon sublayer is thicker than 20 Å, it may not be satisfactorily removed in a later etching process that implements phosphoric acid ($H_3PO_4$). When the silicon sublayer is thinner than 0.1 Å, the silicon sublayer may not provide the first gate spacer layer 226 with sufficient protection.

Figure 17:
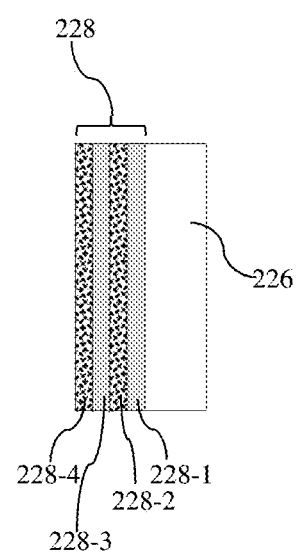

In some embodiments, the second gate spacer layer 228 may include multiple silicon sublayers and multiple nitrogen-based sublayers that are alternately formed. For example, the second gate spacer layer 228 may include a first silicon sublayer on the first gate spacer layer 226, a first nitrogen-based sublayer on the first silicon sublayer, a second silicon sublayer on the first nitrogen-based sublayer, and then a second nitrogen-based sublayer on the second silicon sublayer. The order may be reversed. For example, the second gate spacer layer 228 may include a first nitrogen-based sublayer on the first gate spacer layer 226, a first silicon sublayer on the first nitrogen-based sublayer, a second nitrogen-based sublayer on the first silicon sublayer, and then a second silicon sublayer on the second nitrogen-based sublayer. Some of these example arrangements are shown in FIG. 17, to be described further below. Referring to FIG. 8, the deposited second gate spacer layer 228 is then etched back to remove the second gate spacer layer 228 on top-facing surfaces, leaving the second gate spacer layer 228 disposed along sidewalls of the first gate spacer layer 226.

Figure 16:
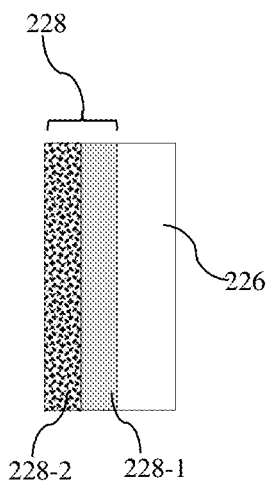
FIGS. 16 and 17 are enlarged schematic cross-sectional views of a portion of the semiconductor device in FIG. 7, according to various aspects of the present disclosure.

Enlarged views of the dotted line area in FIG. 7 according to various embodiments are illustrated in FIGS. 16 and 17. Reference is first made to FIG. 16, which illustrates embodiments where the second gate spacer layer 228 includes a first silicon sublayer 228-1 and a first nitrogen-containing sublayer 228-2. In the embodiments represented in FIG. 16, the first silicon sublayer 228-1 may include silicon and the first nitrogen-containing sublayer 228-2 may include silicon carbonitride, silicon boron nitride, silicon nitride, silicon oxynitride, or silicon oxycarbonitride. In some alternative embodiments not explicitly shown in FIG. 16, the order of deposition of the first silicon sublayer 228-1 and the first nitrogen-containing sublayer 228-2 may be reversed.

Reference is then made to FIG. 17, which illustrates embodiments where the second gate spacer layer 228 includes a first silicon sublayer 228-1, a first nitrogen-containing sublayer 228-2, a second silicon sublayer 228-3, and a second nitrogen-containing sublayer 228-4. In the embodiments represented in FIG. 17, the first silicon sublayer 228-1 and the second silicon sublayer 228-3 may include silicon and the first nitrogen-containing sublayer 228-2 and the second nitrogen-containing sublayer 228-4 may include silicon carbonitride, silicon boron nitride, silicon nitride, silicon oxynitride, or silicon oxycarbonitride. In some alternative embodiments not explicitly shown in FIG. 17, the deposition order of the first silicon sublayer 228-1, the first nitrogen-containing sublayer 228-2, the second silicon sublayer 228-3, the second nitrogen-containing sublayer 228-4 may be reversed. In still some embodiments, additional silicon sublayers and additional nitrogen-containing layers may be alternatingly deposited such that the second gate spacer layer 228 may include more than 4 sublayers.

Figure 9:
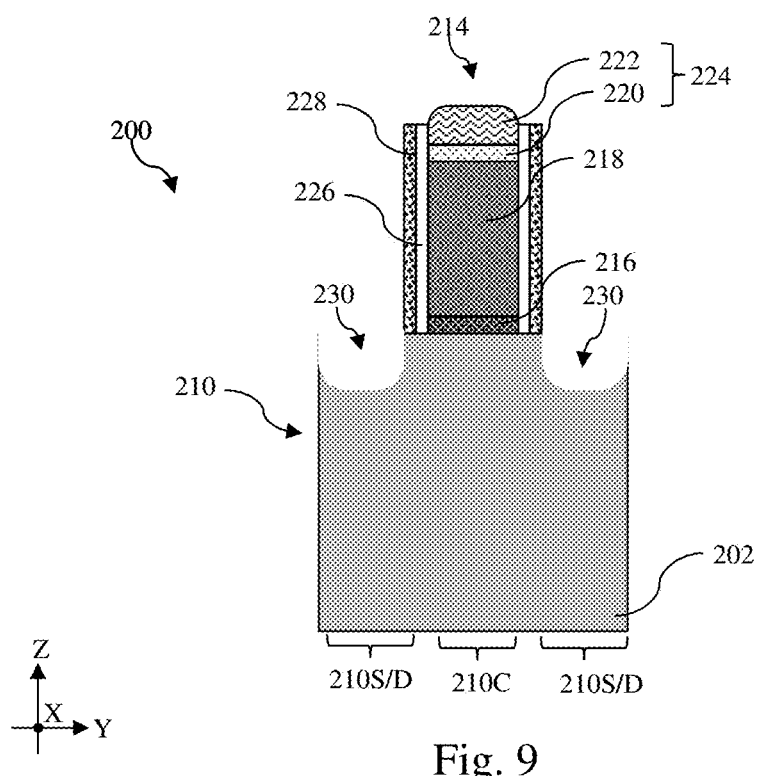

Referring to FIGS. 1 and 9, method 100 includes a block 112 where source/drain regions 210SD of the fin 210 are recessed to form source/drain recesses 230. In some embodiments, the source/drain regions 210SD are anisotropically etched by a dry etch or a suitable etching process to form the source/drain recesses 230. For example, the dry etch process may implement oxygen ($O_2$), an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. As shown in FIG. 9, after the formation of the source/drain recesses 230, the first gate spacer layer 226 and the second gate spacer layer 228 may remain disposed along sidewalls of the dummy gate stack 214. In some embodiments not explicitly shown, a portion of the second gate spacer layer 228 may be consumed during operations at block 112 and silicon-containing polymeric byproducts from reaction between the at least one silicon sublayer and the etching gases of the dry etch process may be redeposited on the first gate spacer layer 226 to protect the first gate spacer layer 226. Redeposition of the silicon-containing polymeric byproducts prevents excessive consumption of the first gate spacer layer 226 during operations at block 112.

Figure 10:
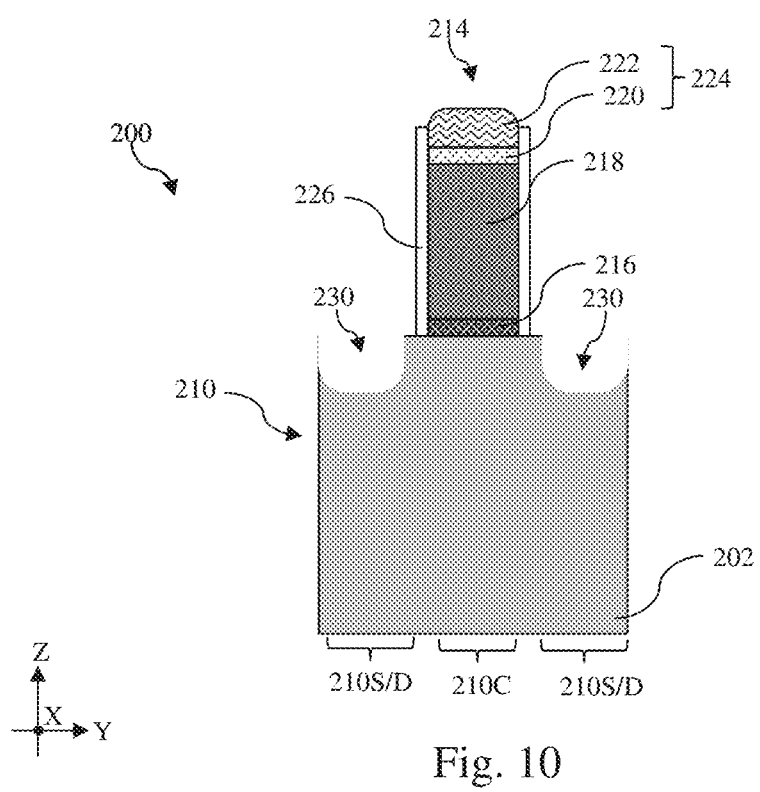

Referring to FIGS. 1 and 10, method 100 includes a block 114 where the second gate spacer layer 228 is removed. In some embodiments, the second gate spacer layer 228 may be removed using selective wet etching or selective dry etching. An example wet etch process may include use of hot phosphoric acid ($H_3PO_4$) solution. In this example, the hot phosphoric acid solution is selective to the nitrogen-based sublayer and etches the substrate 202, the silicon sublayer(s), and the first gate spacer layer 226 at a much slower rate. Because selective wet etching at block 114 etches the silicon sublayer at a slower rate, the thickness of the silicon sublayer (or each silicon sublayer, when there are multiple silicon sublayers) may be exceed 20 Å or the second gate spacer layer 228 may not be completely removed.

Figure 11:
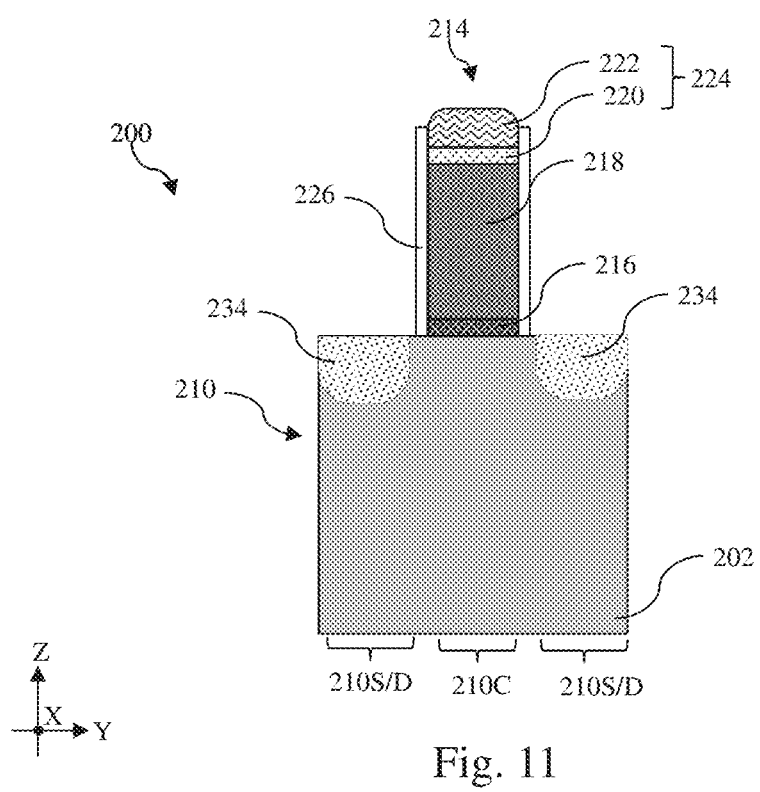

Referring to FIGS. 1 and 11, method 100 includes a block 116 where source/drain features 234 are formed in the source/drain recesses 230. The source/drain features 234 may be epitaxially and selectively formed from surfaces of the source/drain recesses 230. Suitable epitaxial processes for block 116 include vapor-phase epitaxy (VPE), ultra-high vacuum CVD (UHV-CVD), molecular beam epitaxy (MBE), and/or other suitable processes. The epitaxial growth process at block 116 may use gaseous precursors, which interact with the composition of the substrate 202 and the fin 210. In some embodiments represented in FIG. 11, overgrowth of the source/drain feature 234 may extend over sidewalls of the first gate spacer layer 226. Depending on the conductivity type of the FinFET on the semiconductor device 200, the source/drain feature 234 may have different compositions. When the FinFET on the semiconductor device 200 is n-type, the source/drain features 234 may include silicon (Si) and may be doped with an n-type dopant, such as phosphorus (P) or arsenic (As). When the FinFET on the semiconductor device 200 is p-type, the source/drain features 234 may include silicon germanium (SiGe) and is doped with a p-type dopant, such as boron (B), boron difluoride ($BF_2$), or gallium (Ga). While not explicitly shown in FIG. 11, the source/drain feature 234 may include two or more epitaxial layers. For example, each of the source/drain features 234 may include a first epitaxial layer, a second epitaxial layer, and a third epitaxial layer that are doped with the same type of dopant but at different doping concentrations to reduce defect density and contact resistance. In one embodiment, the source/drain feature 234 may include phosphorus-doped silicon (Si:P) when n-type FinFETs are desired and may include boron-doped silicon germanium (SiGe:B) when p-type FinFETs are desired.

Figure 12:
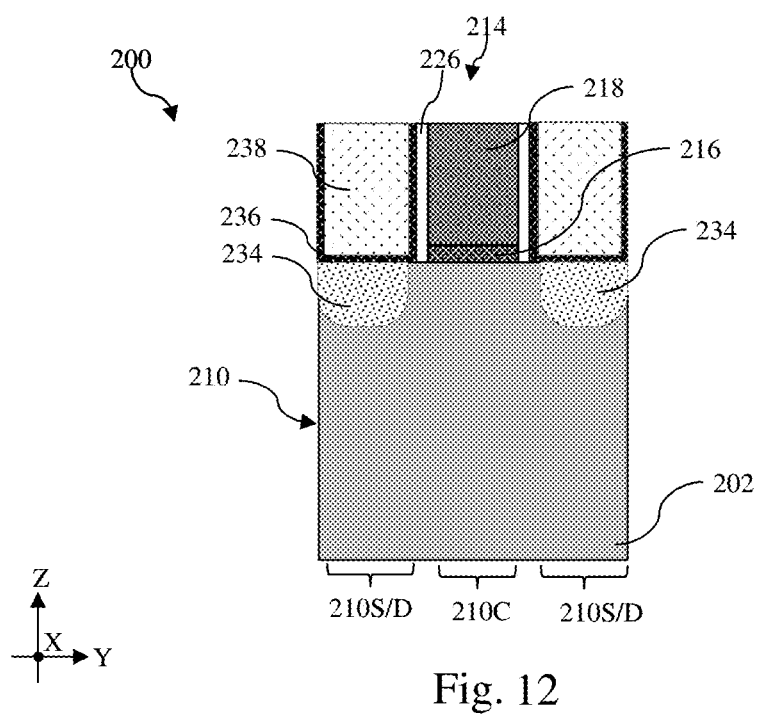

Referring to FIGS. 1 and 12, method 100 includes a block 118 where a contact etch stop layer (CESL) 236 and a first interlayer dielectric (ILD) layer 238 are deposited. As shown in FIG. 12, the CESL 236 is formed prior to forming the first ILD layer 238. In some examples, the CESL 236 includes silicon nitride, silicon oxynitride, and/or other materials known in the art. The CESL 236 may be formed by ALD, plasma-enhanced chemical vapor deposition (PECVD) process and/or other suitable deposition processes. The first ILD layer 238 is then deposited over the CESL 236. In some embodiments, the first ILD layer 238 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The first ILD layer 238 may be deposited by a PECVD process or other suitable deposition technique. In some embodiments, after formation of the first ILD layer 238, the workpiece 200 may be annealed to improve integrity of the first ILD layer 238.

In some alternative embodiments, the composition and formation of the CESL 236 may be similar to those of the second gate spacer layer 228. In these alternative embodiments, the CESL 236 is a multi-layer and includes at least one silicon sublayer and at least one nitrogen-containing layer. Each of the at least one silicon sublayer in the CESL 236 may be formed by thermal atomic layer deposition (ALD) using a silicon-based precursor. Examples of such a silicon-based precursor may include dichlorosilane (DCS), monochlorosilane (MCS), or hexachlorodisilane (HCD). The process temperature for depositing the silicon sublayer may vary when different silicon-based precursors are used. In instances where DCS is used as a precursor, the deposition temperature of the ALD process may be between about 500° C. and about 600° C. In instances where MCS is used as a precursor, the deposition temperature of the ALD process may be between about 350° C. and about 450° C. In instances where hexachlorodisilane (HCD) is used as a precursor, the deposition temperature may be between about 540° C. and about 640° C. It is observed that when the deposition temperature of a silicon sublayer is below the foregoing deposition temperature range, the activation energy for the surface reaction may not be reached and the deposition may not take place effectively. When the deposition temperature exceeds the foregoing deposition temperature range, the ALD deposition may happen too quickly and become more CVD-like, leaving insufficient room to form the first ILD layer 238. In some embodiments, the deposition pressure for the at least one silicon sublayer is between about 1 Torr and about 10 Torr. Each of the at least one nitrogen-based sublayer may be formed by thermal atomic layer deposition (ALD) or plasma-enhanced ALD (PEALD). In some embodiments, each of the at least one nitrogen-based sublayer may include silicon carbonitride, silicon boron nitride, silicon nitride, silicon oxynitride, or silicon oxycarbonitride. In instances where CESL 236 is a multi-layer, a thickness of the nitrogen-based sublayer in the CESL 236 is greater than a thickness of the silicon sublayer in the CESL 236. When devices have larger dimensions and there is less risk that the CESL 236 limits the deposition of the first ILD layer 238, the CESL 236 may be deposited using CVD.

In some embodiments, the CESL 236 may include multiple silicon sublayers and multiple nitrogen-based sublayers that are alternately formed. For example, the CESL 236 may include a first silicon sublayer on the source/drain features 234, a first nitrogen-based sublayer on the first silicon sublayer, a second silicon sublayer on the first nitrogen-based sublayer, and then a second nitrogen-based sublayer on the second silicon sublayer. The order may be reversed. For example, the CESL 236 may include a first nitrogen-based sublayer on the source/drain features 234, a first silicon sublayer on the first nitrogen-based sublayer, a second nitrogen-based sublayer on the first silicon sublayer, and then a second silicon sublayer on the second nitrogen-based sublayer. After the deposition of the CESL 236 and the first ILD layer 238, the workpiece 200 is planarized using, for example, a CMP process, to expose the dummy electrode layer 218 and the provide a planar top surface.

Figure 13:
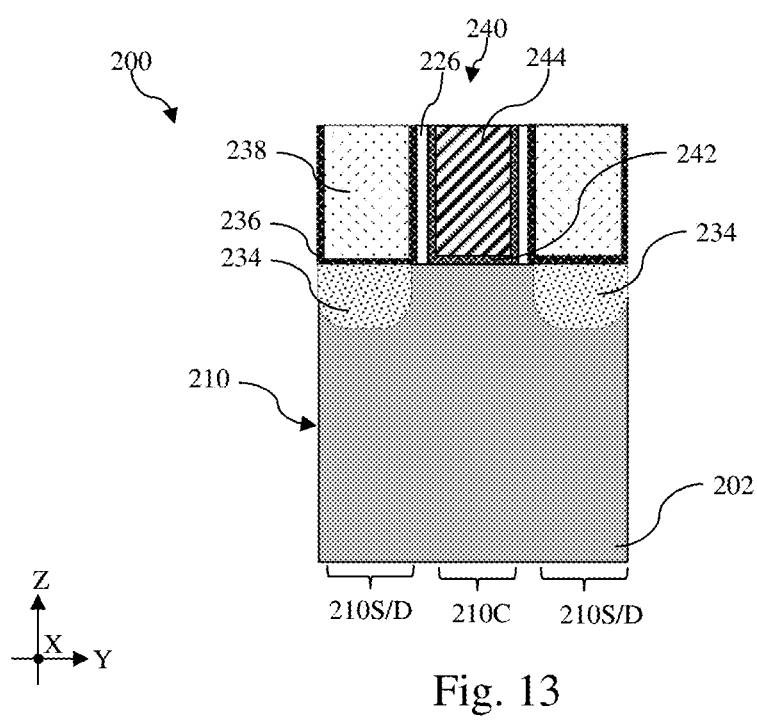

Referring to FIGS. 1 and 13, method 100 includes a block 120 where the dummy gate stack 214 is replaced with a gate structure 240. Operations at block 120 include removal of the dummy gate stack 214 and formation of the gate structure 240 to wrap over the channel region 210C of the fin 210. Referring to FIG. 13, the dummy gate stack 214 exposed at the conclusion of block 118 is removed from the workpiece 200 by a selective etch process. The selective etch process may be a selective wet etch process, a selective dry etch process, or a combination thereof. In the depicted embodiments, the selective etch process selectively removes the dummy dielectric layer 216 and the dummy electrode layer 218 without substantially damaging the first gate spacer layer 226, the first ILD layer 238, and CESL 236. The removal of the dummy gate stack 214 results in a gate trench over the channel region 210C. After the removal of the dummy gate stack 214, the gate structure 240 is then deposited over the workpiece 200 to wrap over the channel region 210C of the fin 210. The gate structure 240 may include a gate dielectric layer 242 on the channel region 210C and a gate electrode layer 244 over the gate dielectric layer 242. Although not explicitly shown FIG. 13, the gate dielectric layer 242 includes an interfacial layer and a high-k dielectric layer. As used herein, high-k dielectric materials include dielectric materials having a high dielectric constant, for example, greater than that of thermal silicon oxide (~3.9). In some embodiments, the interfacial layer includes silicon oxide and may be formed as result of a pre-clean process. An example pre-clean process may include use of RCA SC-1 (ammonia, hydrogen peroxide and water) and/or RCA SC-2 (hydrochloric acid, hydrogen peroxide and water). The pre-clean process oxidizes the exposed surfaces of the channel region 210C to form the interfacial layer. The high-k dielectric layer is then deposited over the interfacial layer using ALD, CVD, and/or other suitable methods. In one embodiment, the high-k dielectric layer may include hafnium oxide. Alternatively, the gate dielectric layer 242 may include other high-K dielectrics, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), $(Ba,Sr)TiO_3$ (BST), silicon nitride (SiN), silicon oxynitride (SiON), combinations thereof, or other suitable material. After the formation or deposition of the gate dielectric layer 242, the gate electrode layer 244 is deposited over the gate dielectric layer 242.

The gate electrode layer 244 may be a multi-layer structure that includes at least one work function layer and a metal fill layer. By way of example, the at least one work function layer may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), or tantalum carbide (TaC). The metal fill layer may include aluminum (Al), tungsten (W), nickel (Ni), titanium (Ti), ruthenium (Ru), cobalt (Co), platinum (Pt), tantalum silicon nitride (TaSiN), copper (Cu), other refractory metals, or other suitable metal materials or a combination thereof. In various embodiments, the gate electrode layer 244 may be formed by ALD, PVD, CVD, e-beam evaporation, or other suitable process. A planarization process, such as a CMP process, may be performed to remove excess materials and provide a planar top surface.

Figure 14:
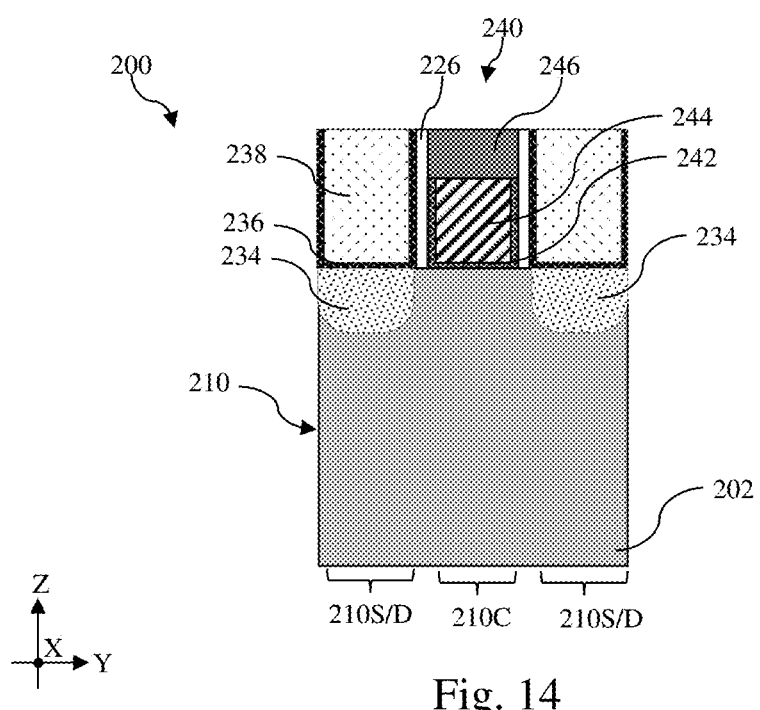

Referring to FIGS. 1 and 14, method 100 includes a block 122 where a self-aligned cap (SAC) layer 246 is formed over the gate structure 240. After the gate structure 240 is formed and the workpiece 200 is planarized, the gate structure 240 is selectively recessed to form a self-aligned cap (SAC) recess. A dielectric material for the SAC layer 246 is then deposited over the workpiece 200, including over the SAC recess, by CVD, PECVD, or a suitable deposition process. The dielectric material for the SAC layer 246 may include silicon oxide, silicon nitride, silicon carbide, silicon carbonitride, silicon oxynitride, silicon oxycarbonitride, aluminum oxide, aluminum nitride, aluminum oxynitride, zirconium oxide, zirconium nitride, zirconium aluminum oxide, hafnium oxide, or a suitable dielectric material. Afterwards, a planarization process, such as a CMP process, may be performed to remove excess dielectric material over the first ILD layer 238, thereby forming the SAC layer 246 in the SAC recess.

Figure 15:
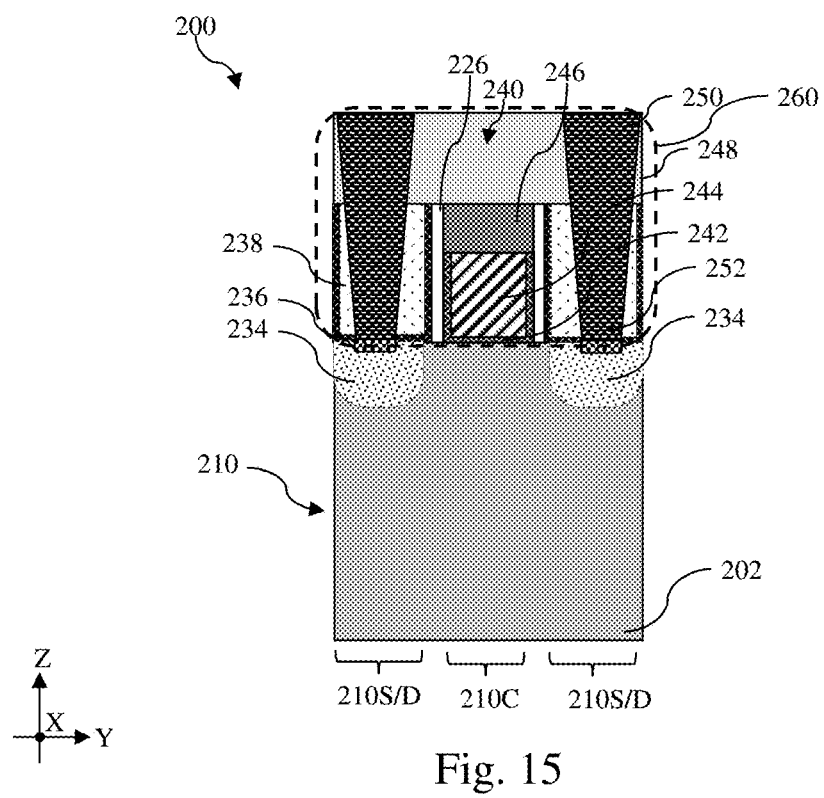

Referring to FIGS. 1 and 15, method 100 includes a block 124 where a second ILD layer 248 is deposited over the workpiece 200. In some embodiments, the second ILD layer 248 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The second ILD layer 248 may be deposited by a PECVD process or other suitable deposition technique. In some embodiments, after formation of the second ILD layer 248, the workpiece 200 may be annealed to improve integrity of the second ILD layer 248.

Referring still to FIGS. 1 and 15, method 100 includes a block 126 where a source/drain contact 250 is formed to couple to the source/drain feature 234. In an example process, lithography processes and etch processes are used to form contact openings through the second ILD layer 248, the first ILD layer 238, and the CESL 236. The contact openings expose the source/drain features 234. To reduce contact resistance, a silicide layer 252 may be formed on the source/drain features 234 by depositing a metal precursor layer over the source/drain features 234 and performing an anneal process to bring about silicidation between the metal precursor layer and the source/drain features 234. Suitable metal precursor layer may include titanium (Ti), tantalum (Ta), nickel (Ni), cobalt (Co), or tungsten (W). The silicide layer 252 may include titanium silicide (TiSi), titanium silicon nitride (TiSiN), tantalum silicide (TaSi), tungsten silicide (WSi), cobalt silicide (CoSi), or nickel silicide (NiSi). After the formation of the silicide layer 252, a metal fill layer may be deposited into the contact openings. The metal fill layer may include titanium nitride (TiN), titanium (Ti), ruthenium (Ru), nickel (Ni), cobalt (Co), copper (Cu), molybdenum (Mo), tungsten (W), tantalum (Ta), or tantalum nitride (TaN). A planarization process may follow to remove excess materials, thereby forming the source/drain contact 250. Due to the planarization process, top surfaces of the source/drain contacts 250 and the second ILD layer 248 are coplanar.

Upon conclusion of operations at block 126, a FinFET 260 is formed, as shown in FIG. 15. The FinFET 260 includes a fin-like channel region 210C extending between two source/drain features 234 along the Y direction. The gate structure 240 wraps over the channel region 210C. The SAC layer 246 is disposed on the gate structure 240. The first gate spacer layer 226 extends continuously along sidewalls of the SAC layer 246. The CESL 236 and the first ILD layer 238 are disposed on the source/drain features 234. The CESL 236 extends along the first gate spacer layer 226. The second ILD layer 248 is disposed on the SAC layer 246, the first gate spacer layer 226, the CESL 236, and the first ILD layer 238. Source/drain contacts 250 extend through the second ILD layer 248, the first ILD layer 238, and the CESL 236 to couple to the source/drain features 234 by way of the silicide layer 252.

Processes of the present disclosure provide benefits. An example process according to the present disclosure includes, after the formation of a fin over a substrate and a dummy gate stack over the fin, a first gate spacer layer and a second gate spacer layer are sequentially deposited along sidewalls of the dummy gate stack. The first gate spacer layer may be a low-k dielectric layer. The second gate spacer layer includes at least one silicon sublayer and at least one nitrogen-containing sublayer. Each of the at least one silicon sublayer may also be referred to as a silicon soak layer and may be formed by atomic layer deposition (ALD) or plasma-enhanced ALD (PEALD). Each of the at least one nitrogen-containing sublayer may include silicon carbonitride, silicon boron nitride, silicon nitride, silicon oxycarbonitride, or silicon oxynitride and may be formed by ALD or PEALD. Etching of the at least one silicon sublayer with an oxygen-containing etchant may produce polymeric byproducts to provide additional protection to the first gate spacer layer. With the added protection, the etching of the source/drain regions does not alter the profiles of the dummy gates, resulting in a uniform height and profile of the functional gate structures that replace the dummy gates. Additionally, by protecting the low-k first spacer layer, the second gate spacer layer of the present disclosure also prevents shorts between the gate structure and the source/drain features.

The present disclosure provides for many different embodiments. In one embodiment, a method is provided. The method includes forming a semiconductor element over a substrate, the semiconductor element including a channel region and a source/drain region, forming a dummy gate stack over the channel region of the semiconductor element, depositing a first spacer layer over sidewalls of the dummy gate stack, depositing a second spacer layer over the first spacer layer, wherein the second spacer layer includes at least one silicon sublayer and at least one nitrogen-containing sublayer, after the depositing of the second spacer layer, etching the source/drain region of the semiconductor element to form a source/drain recess, and after the etching, removing the second spacer layer.

In some embodiments, a dielectric constant of the first spacer layer is smaller than a dielectric constant of the at least one silicon sublayer and a dielectric constant of the at least one nitrogen-containing sublayer. In some embodiments, the depositing of the second spacer layer includes depositing the at least one silicon sublayer using dichlorosilane (DCS) at a deposition temperature between about 500° C. and about 600° C. In some instances, the depositing of the second spacer layer includes depositing the at least one silicon sublayer using monochlorosilane (MCS) at a deposition temperature between about 350° C. and about 450° C. In some implementations, the depositing of the second spacer layer includes depositing the at least one silicon sublayer using hexachlorodisilane (HCD) at a deposition temperature between about 540° C. and about 640° C. In some instances, the etching of the source/drain region of the semiconductor element includes use of oxygen and a fluorocarbon. In some embodiments, the etching of the source/drain region of the semiconductor element produces a polymeric byproduct that includes silicon, carbon, oxygen, and fluorine. In some embodiments, the removing of the second spacer layer includes use of hot phosphoric acid solution.

In another embodiment, a method is provided. The method includes providing a workpiece that includes a semiconductor element including a channel region and a source/drain region, and a dummy gate stack wrapping over the channel region of the semiconductor element, depositing a first spacer layer over sidewalls of the dummy gate stack, depositing a second spacer layer over the first spacer layer, wherein the second spacer layer includes at least one silicon sublayer and at least one nitrogen-containing sublayer, after the depositing of the second spacer layer, etching the source/drain region of the semiconductor element to form a source/drain recess, after the etching, removing the second spacer layer, and after the removing of the second spacer layer, forming a source/drain feature in the source/drain recess.

In some embodiments, a thickness of each of the at least one silicon sublayer is between about 0.1 Å and about 20 Å. In some implementations, the depositing of the second spacer layer includes depositing one of the at least one silicon sublayer directly on the first spacer layer. In some instances, the depositing of the second spacer layer includes depositing the at least one silicon sublayer using atomic layer deposition (ALD). In some embodiments, the depositing of the at least one silicon sublayer includes a deposition pressure between about 1 Torr and about 10 Torr. In some embodiments, the at least one nitrogen-containing sublayer includes silicon carbonitride, silicon boron nitride, silicon nitride, silicon oxycarbonitride, or silicon oxynitride.

In yet another embodiment, a method is provided. The method includes forming a dummy gate stack over a semiconductor element, depositing a first spacer layer over sidewalls of the dummy gate stack, and depositing a second spacer layer over the first spacer layer, wherein the depositing of the second spacer layer includes depositing a silicon sublayer over the first spacer layer using atomic layer deposition (ALD) and depositing a nitrogen-containing sublayer over the silicon sublayer using ALD. In some embodiments, the depositing of the silicon sublayer includes use of dichlorosilane (DCS) and a deposition temperature between about 500° C. and about 600° C. In some implementations, the depositing of the silicon sublayer includes use of monochlorosilane (MCS) and a deposition temperature between about 350° C. and about 450° C. In some instances, the depositing of the silicon sublayer includes use of hexachlorodisilane (HCD) and a deposition temperature between about 540° C. and about 640° C. In some embodiments, the nitrogen-containing sublayer includes silicon carbonitride, silicon boron nitride, silicon nitride, silicon oxycarbonitride, or silicon oxynitride. In some instances, the depositing of the second spacer layer further includes depositing another nitrogen-containing sublayer over the silicon sublayer, and depositing another silicon sublayer over the another nitrogen-containing sublayer. The nitrogen-containing sublayer is deposited on the another silicon sublayer.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method, comprising:
   forming a semiconductor element over a substrate, the semiconductor element including a channel region and a source/drain region;
   forming a dummy gate stack over the channel region of the semiconductor element;
   depositing a first spacer layer over sidewalls of the dummy gate stack;
   depositing a second spacer layer over the first spacer layer, wherein the second spacer layer comprises at least one silicon sublayer and at least one nitrogen-containing sublayer;
   after the depositing of the second spacer layer, etching the source/drain region of the semiconductor element to form a source/drain recess; and
   after the etching, removing the second spacer layer.

2. The method of claim 1, wherein a dielectric constant of the first spacer layer is smaller than a dielectric constant of the at least one silicon sublayer and a dielectric constant of the at least one nitrogen-containing sublayer.

3. The method of claim 1, wherein the depositing of the second spacer layer comprises:
   depositing the at least one silicon sublayer using dichlorosilane (DCS) at a deposition temperature between about 500° C. and about 600° C.

4. The method of claim 1, wherein the depositing of the second spacer layer comprises:

depositing the at least one silicon sublayer using monochlorosilane (MCS) at a deposition temperature between about 350° C. and about 450° C.

5. The method of claim 1, wherein the depositing of the second spacer layer comprises:
depositing the at least one silicon sublayer using hexachlorodisilane (HCD) at a deposition temperature between about 540° C. and about 640° C.

6. The method of claim 1, wherein the etching of the source/drain region of the semiconductor element comprises use of oxygen and a fluorocarbon.

7. The method of claim 6, wherein the etching of the source/drain region of the semiconductor element produces a polymeric byproduct that includes silicon, carbon, oxygen, and fluorine.

8. The method of claim 1, wherein the removing of the second spacer layer comprises use of hot phosphoric acid solution.

9. A method, comprising:
providing a workpiece that includes:
a semiconductor element comprising a channel region and a source/drain region, and
a dummy gate stack wrapping over the channel region of the semiconductor element;
depositing a first spacer layer over sidewalls of the dummy gate stack;
depositing a second spacer layer over the first spacer layer, wherein the second spacer layer comprises at least one silicon sublayer and at least one nitrogen-containing sublayer;
after the depositing of the second spacer layer, etching the source/drain region of the semiconductor element to form a source/drain recess;
after the etching, removing the second spacer layer; and
after the removing of the second spacer layer, forming a source/drain feature in the source/drain recess.

10. The method of claim 9, wherein a thickness of each of the at least one silicon sublayer is between about 0.1 Å and about 20 Å.

11. The method of claim 9, wherein the depositing of the second spacer layer comprises:
depositing one of the at least one silicon sublayer directly on the first spacer layer.

12. The method of claim 9, wherein the depositing of the second spacer layer comprises:
depositing the at least one silicon sublayer using atomic layer deposition (ALD).

13. The method of claim 9, wherein the depositing of the at least one silicon sublayer comprises a deposition pressure between about 1 Torr and about 10 Torr.

14. The method of claim 9, wherein the at least one nitrogen-containing sublayer comprises silicon carbonitride, silicon boron nitride, silicon nitride, silicon oxycarbonitride, or silicon oxynitride.

15. A method, comprising:
forming a dummy gate stack over a semiconductor element;
depositing a first spacer layer over sidewalls of the dummy gate stack; and
depositing a second spacer layer over the first spacer layer, wherein the depositing of the second spacer layer comprises:
depositing a silicon sublayer over the first spacer layer using atomic layer deposition (ALD), and
depositing a nitrogen-containing sublayer over the silicon sublayer using ALD.

16. The method of claim 15, wherein the depositing of the silicon sublayer comprises:
use of dichlorosilane (DCS), and
a deposition temperature between about 500° C. and about 600° C.

17. The method of claim 15, wherein the depositing of the silicon sublayer comprises:
use of monochlorosilane (MCS), and
a deposition temperature between about 350° C. and about 450° C.

18. The method of claim 15, wherein the depositing of the silicon sublayer comprises:
use of hexachlorodisilane (HCD), and
a deposition temperature between about 540° C. and about 640° C.

19. The method of claim 15, wherein the nitrogen-containing sublayer comprises silicon carbonitride, silicon boron nitride, silicon nitride, silicon oxycarbonitride, or silicon oxynitride.

20. The method of claim 15, wherein the depositing of the second spacer layer further comprises:
depositing another nitrogen-containing sublayer over the silicon sublayer, and
depositing another silicon sublayer over the another nitrogen-containing sublayer,
wherein the nitrogen-containing sublayer is deposited on the another silicon sublayer.

* * * * *